United States Patent [19]

Yoshida et al.

[11] Patent Number: 5,246,513
[45] Date of Patent: Sep. 21, 1993

[54] DIE BONDING APPARATUS AND METHOD OF CONTROLLING THE SAME

[75] Inventors: Masaharu Yoshida; Toshinobu Banjo; Akira Yamamoto, all of Fukuoka, Japan

[73] Assignee: Mitsubishi Denki Kabushiki Kaisha, Tokyo, Japan

[21] Appl. No.: 763,214

[22] Filed: Sep. 20, 1991

[30] Foreign Application Priority Data

Sep. 26, 1990 [JP] Japan .................................. 2-254111

[51] Int. Cl.⁵ .............................................. B32B 31/00
[52] U.S. Cl. ...................................... 156/64; 156/358
[58] Field of Search .......................... 156/358, 64, 350

[56] References Cited

U.S. PATENT DOCUMENTS 4,909,869 3/1990 Sakamoto et al. ..................... 156/64
4,913,763 4/1990 Yamazaki et al. ................... 156/358
5,080,736 1/1992 Matsui ................................. 156/364

FOREIGN PATENT DOCUMENTS 62-20337 1/1987 Japan .
62-71240 4/1987 Japan .

Primary Examiner—David A. Simmons
Assistant Examiner—William J. Matney, Jr.
Attorney, Agent, or Firm—Leydig, Voit & Mayer

[57] ABSTRACT

A die bonding apparatus includes a Z-axis direction drive mechanism having a main drive motor, a bonding arm having a first arm and a second arm, a holding device provided on one end of the second arm for releasably holding a die, a torque generating device for applying a torque to the second arm, a parallel position detecting device for detecting a displacement of the second arm from a state in which the die and the bonding surface are parallel to each other and for generating a displacement signal, and a control device for storing an inclination of the bonding surface beforehand and for controlling the descent of the second arm and the application of a load to the die.

7 Claims, 4 Drawing Sheets

DIE BONDING APPARATUS AND METHOD OF CONTROLLING THE SAME

BACKGROUND OF THE INVENTION

The present invention relates to a die bonding apparatus for bonding a die to the bonding surface of a substrate or leadframe, and a method of controlling such an apparatus.

DESCRIPTION OF THE RELATED ART

FIG. 4 is a side elevation view of the internal mechanism of a conventional die bonding apparatus disclosed in, for example, Japanese Patent Laid-Open No. 20337/1987 with a casing located on this side removed. A die bonding apparatus 1 is provided on one side of and adjacent to a conveying mechanism 2 for conveying leadframes 3. The conveying mechanism 2 functions as a bonding stage. In the die bonding apparatus 1, a Z axis direction drive mechanism 5 is mounted on a XY table 4. The XY table 4 moves the Z axis direction drive mechanism 5 in the X and Y directions. The Z axis direction drive mechanism 5 includes a casing 6, a ball screw rotatably provided within the casing 6, and a movable block 8 engaged with the ball screw 7. The ball screw 7 is rotated by a predetermined angle through a belt 9a by means of a motor 9 mounted on the housing 6. Rotation of the ball screw 7 moves the movable block 8 in the Z axis direction by a predetermined distance. Within the movable block 8, a bonding arm 10 is provided in such a manner as to be pivotal about a support shaft 11. One end of the bonding arm 10 located within the movable block 8 is in contact with a stopper 14. Normally, the bonding arm 10 is in contact with the stopper 14 and is thereby prevented from being rotated counterclockwise. The stopper 14 also functions as a touch sensor for detecting separation of the bonding arm 10 from the stopper 14 and for transmitting a signal to a control unit 16 when the bonding arm 10 pivots clockwise. Also, a voice coil motor 15 is mounted within the movable block 8 at a position opposite to the stopper 14 to rotate the bonding arm 10 about the support shaft 11 counterclockwise.

On the outer end of the bonding arm 10 which extends from the movable block 8 substantially in a horizontal direction, a collet 18 is mounted in the vertical direction. A die 20 is attracted to the lowermost end of the collet 18. The collect 18 is connected to a suction pipe 19 for vacuum sucking.

The operation of the conventional die bonding apparatus will be described below. First, the leadframe 3 is conveyed to a predetermined position on a bonding stage (not shown) by the conveying mechanism 2. Concurrently with this, the die 20 is grasped by means of a vacuum by the collet 18 mounted on the distal end of the bonding arm 10. Next, the entire Z axis direction drive mechanism 5 is moved by the XY table 4 such that the die 20 can be located above the bonding surface (not shown) of the leadframe 3. Thereafter, the motor 9 is rotated to move the movable block 8 engaged with the ball screw 7 downward and thereby move the collet downward in a state in which it holds the die 20. When the die 20 lands at the bonding surface of the leadframe 3, the collet 18 is subjected to the reaction generated by the contact of the die 20 with the bonding surface and the bonding arm 10 is thereby slightly rotated clockwise. As the bonding arm 10 pivots, it is separated from the stopper 14. This separation is detected by the stopper 14 serving as the touch sensor, and the detection data is transmitted to the control unit 16. The control unit 16 further moves the movable block 8 downward by a predetermined distance on the basis of the detection data and then stops rotation of the motor 9 to stop the downwardly moving movable block 8, i.e., the collet, at a predetermined position. This downward movement after detection is conducted on the basis of a value input in the control unit 16 beforehand to move the die 20 held by the collet 18 to a position where it is parallel to the bonding surface of the leadframe 3. Landing of the die 20 is detected and the downward movement of the collet 18 is stopped on the basis of the detection data. Consequently, the die 20 can be stopped parallel to the bonding surface. In that state, the die 20 is pressed against the bonding surface by the scrubbing operation of the collet 18, by which die bonding is completed.

In the conventional die bonding apparatus of the above-described type, detection of the separation of the stopper from the bonding arm is interpreted as landing of the die at the bonding surface, and landing is not reconfirmed. Furthermore, to make the die parallel to the bonding surface, the movable block is further moved downward through a fixed distance after the die lands. However, it is not checked whether or not the die is parallel to the bonding surface. Therefore, no measure has been taken to prevent malfunction. When the die is bonded to the bonding surface in an inclined state, a bonding agent (e.g., a resin spacer or solder) for bonding the die to the bonding surface may be made non-uniform. This may lead to disability of recognition of the terminal pattern on the die and a non-uniform resistance between the rear surface of the die and the bonding surface during a subsequent wire bonding process.

SUMMARY OF THE INVENTION

Accordingly, an object of the present invention is to provide a die bonding apparatus which is capable of bonding a die to a bonding surface and of applying a load to the die perpendicular thereto while confirming that the die is parallel to a leadframe by feedback control, and a method of controlling such a die bonding apparatus.

In order to achieve the above object, according to one aspect of the present invention, there is provided a die bonding apparatus for bonding a die to a bonding surface. The die bonding apparatus comprises: a Z-axis direction drive mechanism having a main drive motor which is numerically controlled and which generates a feedback signal representing a rotational position and a rotational speed of the motor; a bonding arm mechanism including a first arm having a horizontally extending support shaft and moved in a vertical direction by the Z-axis direction drive mechanism, and a second arm extending from the support shaft in two directions and rotatably supported by the support shaft; a holding means provided on one end of the second arm for releasably holding the die; a torque generation means whose output is controllable the torque generation means being provided between the other end of the second arm and the first arm for applying a torque to the second arm such that the die can be made parallel to the bonding surface; a parallel position detection means provided between the first arm and the second arm for detecting a displacement of the second arm from a state in which the die and the bonding surface are parallel to each other and for generating a displacement signal; and a control means for storing an inclination of the bonding surface beforehand and for performing a lowering control in which the torque generation means and the Z-axis direction drive mechanism are controlled according to a feedback signal from the main drive motor of the Z axis direction drive mechanism and the displacement signal from the parallel position detection means so as to lower the second arm while holding the second arm in a horizontal position such that the die held by the holding device is made parallel to the bonding surface and thereby land the die to the bonding surface parallel thereto, the control means also performing a load applying operation in which a load is applied to the die in a direction perpendicular thereto after the landing of the die is detected.

According to another aspect of the present invention, there is provided a method of controlling a die bonding apparatus.

In this invention, control of the Z-axis direction drive means and a linear motor is conducted so as to lower the second arm in the Z-axis direction while maintaining it in a parallel state and thereby land the die at the bonding surface parallel thereto. During the control, a feedback signal in the form of a displacement signal from a parallel position detection means is generated. The displacement signal represents a displacement of the second arm of the bonding arm mechanism from the state in which the second arm is parallel to the bonding surface. Thereafter, a load is applied to the die perpendicular thereto when the die is pressed against the bonding surface.

DETAILED DESCRIPTION OF THE PREFERRED EMBODIMENTS

Figure 1:
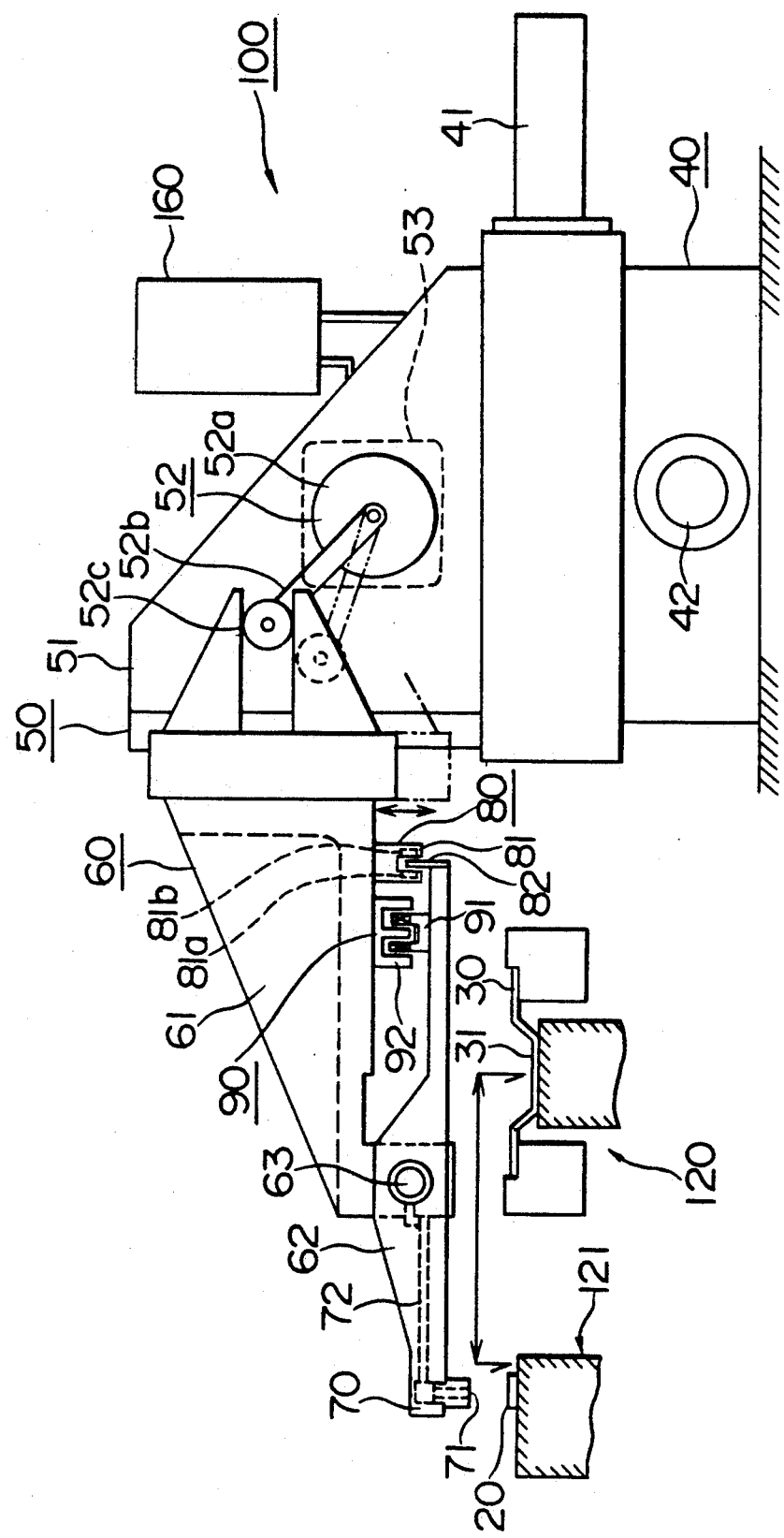
FIG. 1 is a side elevation view of an embodiment of a die bonding apparatus according to the present invention.

An embodiment of the present invention will be described below with reference to the accompanying drawings. Referring first to FIG. 1, a die bonding apparatus 100 is provided on one side of and adjacent to a conveying mechanism 120. The conveying mechanism 120 conveys leadframes 30 and serves as a bonding stage. Dies 20 are placed on a table 121 provided adjacent to the conveying mechanism 120.

In the die bonding apparatus 100, a Z axis direction drive mechanism 50 can be moved along a horizontal plane by an XY table 40. The XY table 40 includes an X-axis actuator 41 and a Y-axis actuator 42 each of which is desirably driven by a servo motor (not shown) with an encoder so as to accurately move the Z-axis direction drive mechanism 50 in both X-axis and Y-axis directions by a desired distance. The XY table 40 is provided only when necessary. If it is not necessary to move the Z-axis direction drive mechanism 50 in XY directions, the Z-axis direction drive mechanism 50 may be mounted directly on a fixed table. Alternatively, either of the X-axis actuator 41 and the Y-axis actuator 42 may be provided.

The Z-axis direction drive mechanism 50 includes a support portion 51 for supporting a bonding arm mechanism 60, which will be described later, in such a manner as to be movable in the vertical direction, a drive mechanism 52 for driving the bonding arm mechanism 60 in the vertical direction, and a servo motor 53 with an encoder for moving the drive mechanism 52 to accurately move the bonding arm mechanism 60 by a desired distance. The drive mechanism 52 includes a rotary shaft 52a rotated by the servo motor 53, an arm 52b fixed to the rotary shaft 52a, and a roller 52c provided at the distal end of the arm 52b in such a manner that it is in rolling contact with the bonding arm mechanism 60. Rotation of the rotary shaft 52b drives the bonding arm mechanism 60 in the vertical direction.

The bonding arm mechanism 60 has a first arm 61 slidably supported by the support portion 51 and extending in the horizontal direction, and a second arm 62 rotatably provided on a support shaft 63.. formed at the distal end of the first arm 61. A collet 70 which is a die holding means is mounted on one end of the second arm 62 in the vertical direction, and a suction port 71 for sucking the die 20 is provided at the lowermost end of the collet 70. A suction pipe 72 is connected to the suction port 71 for vacuum suction. On the other side of the support shaft 63, an analog photo sensor 80, serving as a parallel position detection means, and a linear motor 90, serving as a torque generation means, are provided between the first and second arms 61 and 62. The analog photo sensor 80 includes an optical sensor 81 provided on the first arm 61, and a blocking plate 82 (or, a slit plate) provided on the second arm 62. The optical sensor 81 has a light-emitting device 81a and a light-receiving device 81b which are provided in an opposed relation. When the second arm 62 pivots about the support shaft 63, the blocking plate 82 intervenes between these devices 81a and 81b to interrupt light, by which displacement of the second arm 62 from the parallel position can be monitored. The optical sensor 81 generates a displacement signal indicating the displacement. As shown in FIG. 1, the linear motor 90 has an electromagnet 91 provided on the second arm 62 and a metal portion or permanent magnet 92 provided on the first arm 61 and separated from the electromagnet 91 by a gap. The linear motor 90 applies a torque to the second arm 62 utilizing the attracting or repelling force between the electromagnet 91 and the metal portion 92 generated by energizing the electromagnet 91. The second arm 62 is subjected to torque on the basis of the displacement signal from the analog photo sensor 80 and is thereby retained parallel to the bonding surface. A fine inclination of the bonding surface is stored in the control circuit beforehand, which will be described later. The analog photo sensor 80 may be constructed from an optical sensor 81 provided on the second arm 62 and a blocking plate 82 provided on the first arm 61. Similarly, the linear motor 90 may be constructed by an electromagnet 91 provided on the first arm 61, and a metal portion 92 provided on the second arm 62.

A control circuit 160 is provided on the Z-axis direction drive mechanism 50 to control the linear motor 90 and the servo motor 53 with the encoder of the Z-axis direction drive mechanism 50 and thereby perform the die bonding process while maintaining the second arm 62 parallel to the bonding surface.

Figure 2:
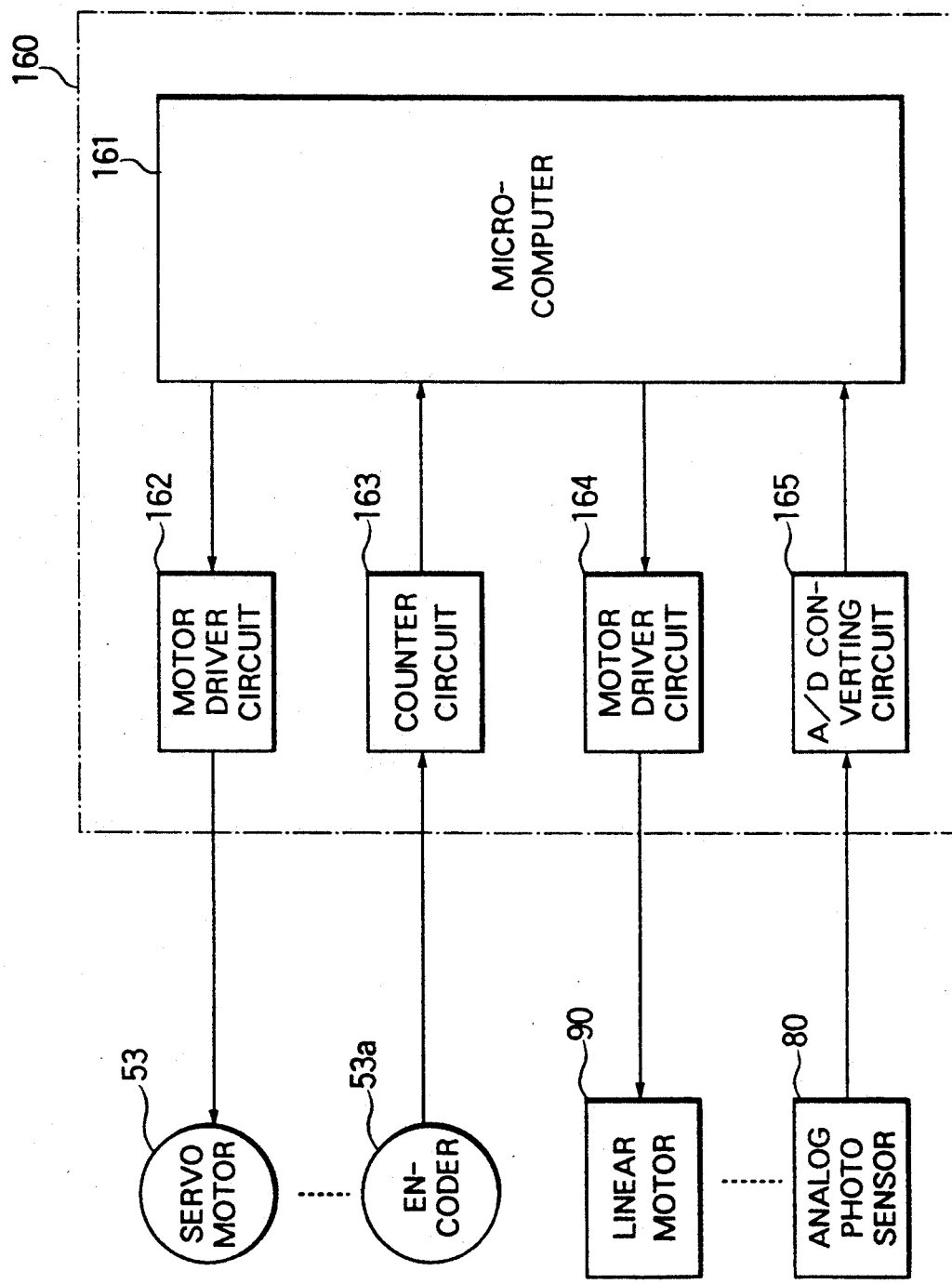
FIG. 2 is a block diagram of a control system of the die bonding apparatus of FIG. 1.

FIG. 2 is a block diagram of a control system for performing the die bonding process by controlling the servo motor 52 with the encoder of the Z-axis direction drive mechanism 50 and the linear motor 90 by means of the control circuit 160. In the control circuit 160, a microcomputer 161 stores a program beforehand and controls the servo motor 53 and the linear motor 90 to accomplish the die bonding process. The microcomputer 161 also stores a fine inclination of the bonding surface, i.e., of a die pad 31. A motor drive circuit 162 drives the servo motor 53 with the encoder of the Z-axis direction drive mechanism 50 according to a signal from the microcomputer 161. A counter circuit 163 counts a feedback signal from an encoder 53a provided on the servo motor 53, the feedback signal representing the rotational position of rotational speed of the motor, and feeds it back to the microcomputer 161. A motor driver circuit 164 drives the linear motor 90 according to a signal from the microcomputer 161. An A/D converting circuit 165 converts an analog feedback signal from the analog photo sensor 80, representing the displacement of the second arm 62 from the parallel position, into a digital signal and feeds the displacement signal back to the microcomputer 161.

Figure 3:
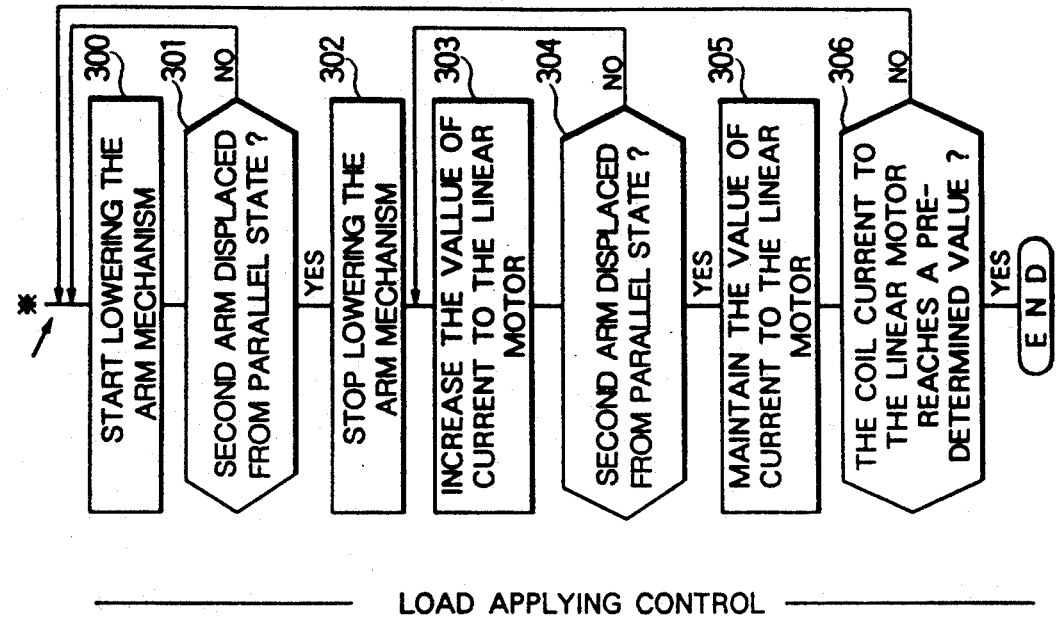
FIG. 3 is a flowchart showing the control operation of the die bonding process.
Figure 3:
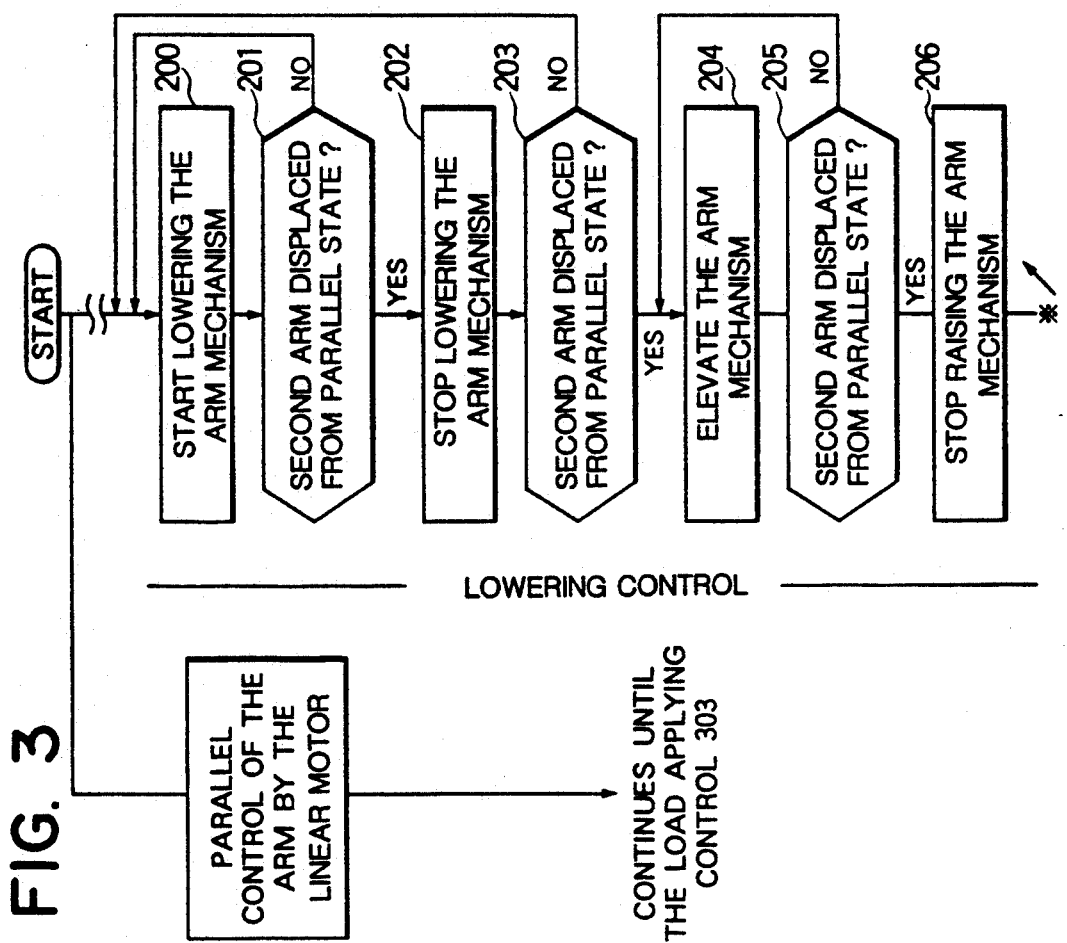
Figure 4:
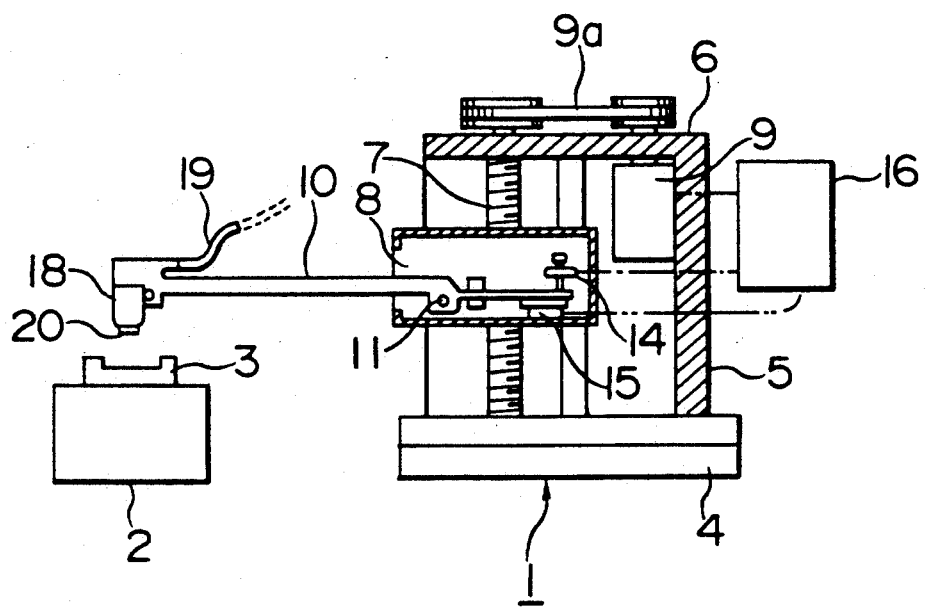
FIG. 4 is a side elevation showing the internal structure of a conventional die bonding apparatus.

FIG. 3 is a flowchart showing the control operation of the die bonding process performed under the control of the control circuit 160 which is characteristic of the present invention.

The operation of the die bonding apparatus shown in FIGS. 1 and 2 will be described below with reference to FIG. 3. First, the die 20 is attracted by the collet 70. Next, the XY table 40 is driven to move the Z-axis direction drive mechanism 50 such that the die 20 is located above the die pad 31 of the leadframe 30. It is assumed that the die 20 is held parallel to the second arm 62, and that the die 20 and the die pad 31 are thus held parallel to each other by making the second arm 62 parallel to the die pad 31. The electromagnet 91 of the linear motor 90 is energized beforehand by an adequate amount of current determined by the stored inclination of the die pad 31 so as to make the second arm 62 parallel to the die pad 31. This control continues until the process of step 303 in the following control operation is completed.

In the control operation, the servo motor 53 of the Z-axis direction drive mechanism 50 is driven to lower the bonding arm mechanism 60. Descent is monitored using a signal from the encoder 53a mounted on the servo motor 53. The signal from the encoder 53a is counted by the counting circuit 163 and then fed back to the microcomputer 161 [step (200)]. During descent, whether a displacement having a predetermined value or more occurs in the parallel state of the second arm 62 is monitored by the analog photo sensor 80. The signal detected by the analog photo sensor 80 is converted into a digital signal by the A/D converter circuit 165 and then is fed back to the microcomputer 161. The aforementioned displacement having the predetermined value or above is greater than that generated by the vibrations caused by the fall of the second arm 62 [step (201)]. If it is detected by the analog photo sensor 80 that the displacement having the predetermined value or more (hereinafter simply referred to as "displacement") occurs in the parallel state of the second arm 62, the operation of the servo motor 53 is stopped to temporarily stop the lowering operation [step (202)]. If it is determined by the signal from the analog photo sensor 80 that the second arm 62 still displaced from the parallel state after the servo motor 53 has stopped, it is determined that the die 20 has landed at the die pad 31. If no displacement is confirmed, it is determined that the die 20 has not yet landed, and the process returns to step 200 to perform the lowering operation [step (203)]. If the landing of the die 20 is confirmed, the servo motor 53 of the Z-axis direction drive mechanism 50 is rotated in a reverse direction to raise the die bonding arm mechanism 60 [step (204)]. The arm mechanism 60 is raised until it is determined by the displacement signal from the analog photo sensor 80 that the second arm 62 is parallel again [step (205)]. If no displacement is detected by the analog photo sensor 80, it is determined that the second arm 62 is parallel, and the operation is thus stopped [step (206)]. The die 20 has now landed at the die pad 31 parallel thereto.

Next, the load control operation begins in which a predetermined load is applied to the die 20 resting on the die pad 31 parallel thereto in a direction perpendicular to the die 20. First, the servo motor 53 of the Z-axis direction drive mechanism 50 is driven to lower the die bonding arm mechanism 60. Descent is detected by the signal from the encoder 53a mounted on the servo motor 53 [step (300)]. This lowering operation continues until a displacement having a second predetermined value or more occurs in the parallel state of the second arm 62. This displacement is monitored by the displacement signal from the analog photo sensor 80. The second predetermined value is much smaller than the predetermined value used in steps 201 and 203 and is large enough to apply a load to the die 20 perpendicular thereto [step (301)]. If it is determined that the displacement having the second predetermined value or more occurs from the parallel state of the second arm 62, the lowering operation is stopped [step (302)]. Next, the coil current supplied to the linear motor 90 is increased so as to increase the attracting force acting between the electromagnet 91 and the metal portion 92 of the linear motor 90 and thereby increase the amount of torque applied to the second arm 62. Consequently, the second arm 62 returns to the parallel state while applying a load to the die 20 [step (303)]. Increase of the coil current to the linear motor 90 continues until the displacement of the second arm 62 is eliminated and the second arm 62 returns to the parallel state [step (304)]. If it is determined that displacement of the second arm 62 is eliminated, the coil current to the linear motor 90 is held at that value [step (305)]. If it is, determined that the coil current to the linear motor 90 has not reached a predetermined value, the process returns to step 300 and the process from step 300 to step 305 is repeated until the coil current to the linear motor 90 reaches the predetermined value. If it is determined that the coil current has reached the predetermined value, the load control is stopped [step (306)]. The process is repeated in a quick cycle so that the load can be applied to the die 20 gradually and perpendicular thereto. If the final value of the coil current to the linear motor 90 is set to an appropriate value, a desired amount of load can be applied to the individual dice.

In the above-described embodiment, a link mechanism is used as the transmission mechanism for the servo motor 53 of the Z-axis direction drive mechanism 50. A ball screw drive mechanism may also be used. The X- and Y-axis actuators 41 and 42 of the XY table 40 may be of the cam drive type.

As will be understood from the foregoing description, in the present invention, the servo motor with the encoder, serving as the drive portion of the Z-axis direction drive mechanism, and the linear motor, serving as the torque generation means for applying a torque to the second arm of the die bonding arm mechanism, are controlled concurrently to land the die to the die pad parallel thereto and then to apply a load to the die perpendicular thereto. Consequently, the die can be bonded to the die pad in an excellent state.

What is claimed is:

1. A die bonding apparatus for bonding a die to a bonding surface comprising:

a Z-axis direction drive mechanism;

a bonding arm mechanism having a first arm moved in a vertical direction by the Z-axis direction drive mechanism and a second arm rotatably supported by the first arm for rotation about a horizontal axis;

holding means on the second arm for releasably holding a die;

torque generation means for applying a torque to the second arm about the horizontal axis;

position detection means for detecting displacement of the second arm about the horizontal axis; and a controller comprising:

means for controlling the Z-axis direction drive mechanism to lower the first arm while controlling the torque generation means in response to the displacement detected by the position detection means to maintain the second arm in a parallel state in which a die held by the holding means is parallel to the bonding surface;

means for stopping the lowering of the first arm by the Z-axis direction drive mechanism when the displacement detected by the position detection means indicates that the second arm is displaced from the parallel state by at least a first distance;

means for raising the first arm, after the lowering of the first arm is stopped, until the second arm returns to the parallel state; and means for controlling the torque generation means to apply a torque to the second arm and thereby urge the die against the bonding surface in a direction perpendicular to the bonding surface.

2. A die bonding apparatus according to claim 1 wherein:

the Z-axis direction drive mechanism comprises a servo motor with an encoder drivingly connected to the first arm;

the torque generation means comprises a linear motor including an electromagnet on one of the first and second arms and a metal portion on the other of the first and second arms for magnetically coupling with the electromagnet;

the parallel position detection means comprises an analog photo sensor including an optical sensor having a light-emitting element and a light-detecting element on one of the first and second arms in an opposed relation and a light blocking plate provided on the other of the first and second arms for intervening between the light-emitting element and the light-detecting element of the optical sensor when the second arm is rotated to interrupt passage of light; and the control means comprises a control circuit for controlling the servo motor and the electromagnet of the linear motor in response to a signal form the encoder and a signal from the optical sensor.

3. A die bonding apparatus according to claim 1 comprising a drive mechanism for moving the Z-axis direction drive mechanism in at least one of X-axis and Y-axis directions.

4. An apparatus as claimed in claim 1 wherein the torque generation means comprises a linear motor having a first portion mounted on the first arm and a second portion mounted on the second arm and magnetically coupled to the first portion across a gap.

5. A method of controlling a die boding apparatus including holding means for holding a die at one end of an arm moved by a Z-axis direction drive mechanism in a vertical direction and rotatably supported by the Z-axis direction drive mechanism for rotation about a horizontal axis, the die bonding apparatus bonding the die to a bonding surface having a known inclination, the control method comprising:

lowering the arm in a parallel state in which a die held by the holding means is parallel to the bonding surface;

stopping the lowering of the arm when the arm is displaced from the parallel state by at least a first distance by rotation about the horizontal axis;

determining that the die held b the holding means has landed at the bonding surface when the arm is still displaced from the parallel state after the lowering operation is stopped and thereafter raising the arm until it returns to the parallel state; and applying a torque to the arm about the horizontal axis to urge the die in a direction perpendicular to and toward the bonding surface.

6. A method as claimed in claim 5 wherein applying a load to the die comprises:

lowering the arm with the die contacting the bonding surface until the arm is displaced from the parallel state by a second distance smaller than the first distance;

applying a torque to the arm about the horizontal axis to return the arm to the parallel state.

7. A method of controlling a die bonding apparatus comprising:

supporting a die with an arm pivotable about an axis;

moving the arm in a first direction towards a bonding surface while maintaining the arm in a parallel state in which the die is parallel to the bonding surface;

stopping movement of the arm in the first direction when the die has contacted the bonding surface and the arm is displaced from the parallel state by pivoting about the axis by a first distance;

moving the arm in a second direction opposite to the first direction until the arm returns to the parallel state with the die in contact with the bonding surface;

again moving the arm in the first direction with the die contacting the bonding surface until the arm is displaced from the parallel state by pivoting about the axis by a second distance smaller than the first distance; and exerting a torque on the second arm about the axis to return the second arm to the parallel state.

* * * * *

UNITED STATES PATENT AND TRADEMARK OFFICE
CERTIFICATE OF CORRECTION

PATENT NO. : 5,246,513

DATED : September 21, 1993

INVENTOR(S) : Yoshida et al.

It is certified that error appears in the above-indentified patent and that said Letters Patent is hereby corrected as shown below:

Item no. [57], Abstract, line 3, after "arm" (first occurrence) insert --mechanism--.

Claim 2, column 8, line 1, change "form" to --from--.

Claim 5, column 8, line 12, change "boding" to --bonding--.

Claim 5, column 8, line 26, change "b" to --by--.

Signed and Sealed this

Twenty-third Day of May, 1995

Attest:

BRUCE LEHMAN

Attesting Officer     Commissioner of Patents and Trademarks